US012542258B2

(12) United States Patent
Ishikawa et al.

(10) Patent No.: US 12,542,258 B2
(45) Date of Patent: Feb. 3, 2026

(54) MEMBER FOR PLASMA PROCESSING APPARATUS, METHOD FOR MANUFACTURING SAME, AND PLASMA PROCESSING APPARATUS

(71) Applicant: MITSUBISHI MATERIALS CORPORATION, Tokyo (JP)

(72) Inventors: Fumiaki Ishikawa, Saitama (JP); Yuto Kurata, Amagasaki (JP); Tsukasa Yasoshima, Sanda (JP); Ichiro Shiono, Amagasaki (JP); Takuma Katase, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 695 days.

(21) Appl. No.: 17/908,050

(22) PCT Filed: Mar. 5, 2021

(86) PCT No.: PCT/JP2021/008772
§ 371 (c)(1),
(2) Date: Aug. 30, 2022

(87) PCT Pub. No.: WO2021/177456
PCT Pub. Date: Sep. 10, 2021

(65) Prior Publication Data

US 2023/0114319 A1 Apr. 13, 2023

(30) Foreign Application Priority Data

Mar. 5, 2020 (JP) ................................ 2020-037969
Feb. 10, 2021 (JP) ................................ 2021-020070

(51) Int. Cl.
*H01J 37/32* (2006.01)
*H01L 21/687* (2006.01)

(52) U.S. Cl.
CPC .... *H01J 37/32642* (2013.01); *H01J 37/3244* (2013.01); *H01J 37/32541* (2013.01);
(Continued)

(58) Field of Classification Search
CPC ............. H01J 37/32642; H01J 37/3244; H01J 37/32541; H01J 37/3255; H01J 2237/334;
(Continued)

(56) References Cited

U.S. PATENT DOCUMENTS

2003/0181065 A1* 9/2003 O'Donnell .......... C23C 16/4404
438/785
2009/0004100 A1* 1/2009 Umemoto ......... H01J 37/32477
118/715

(Continued)

FOREIGN PATENT DOCUMENTS

CN 101920256 A 12/2010
CN 107026102 A 8/2017

(Continued)

OTHER PUBLICATIONS

International Search Report mailed May 25, 2021, issued for PCT/JP2021/008772 and English translation thereof.

(Continued)

*Primary Examiner* — Rudy Zervigon
(74) *Attorney, Agent, or Firm* — Troutman Pepper Locke LLP; James E. Armstrong, IV; Nicholas J. DiCeglie, Jr.

(57) ABSTRACT

A member for a plasma processing apparatus includes a base material and a heat transfer layer provided on one surface of the base material, and the heat transfer layer contains at least one of a fluorine-based resin and a fluorine-based elastomer.

20 Claims, 3 Drawing Sheets

(52) U.S. Cl.
CPC .... *H01J 37/3255* (2013.01); *H01L 21/68721* (2013.01); *H01J 2237/334* (2013.01)

(58) Field of Classification Search
CPC .......... H01J 37/32522; H01J 37/32724; H01J 15/00; H01J 37/32091; H01J 37/32082; H01J 37/32623; H01J 37/32009; H01J 37/32532; H01L 21/68721; H01L 21/67069; C23C 16/45565; C23C 16/45572; C23C 16/4558; C23C 16/455; C23C 16/4412; C23C 16/18; C23C 16/4481; C23C 16/507; C23C 16/509; C23C 16/5096; B05D 1/60
USPC .......... 118/715, 723 E, 723 ER; 156/345.33, 156/345.34, 345.43, 345.44, 345.45, 156/345.46, 345.47; 427/248.1, 569, 570, 427/535, 96.8, 255.23, 255.28
See application file for complete search history.

(56) References Cited

U.S. PATENT DOCUMENTS

| | | | | |
|---|---|---|---|---|
| 2009/0229857 | A1* | 9/2009 | Fredenberg .............. | C25D 7/12 156/60 |
| 2011/0083806 | A1* | 4/2011 | Noguchi ........... | H01J 37/32477 118/723 R |
| 2012/0247672 | A1 | 10/2012 | Kobayashi | |
| 2012/0247954 | A1 | 10/2012 | Yamawaku et al. | |
| 2014/0116338 | A1* | 5/2014 | He .......................... | C23C 14/06 118/723 R |
| 2015/0114567 | A1 | 4/2015 | Nagayama et al. | |
| 2017/0314125 | A1* | 11/2017 | Fenwick ............... | C23C 28/042 |
| 2025/0210318 | A1* | 6/2025 | Shoji ................. | H01J 37/32724 |

FOREIGN PATENT DOCUMENTS

| | | | |
|---|---|---|---|
| JP | 2005-285845 | A | 10/2005 |
| JP | 2011-086920 | A | 4/2011 |
| JP | 2011079732 | A | 4/2011 |
| JP | 2012-009563 | A | 1/2012 |
| JP | 2012-209359 | A | 10/2012 |
| JP | 2015-084383 | A | 4/2015 |
| JP | 5762798 | B2 | 8/2015 |
| JP | 2019-102654 | A | 6/2019 |
| TW | 201142938 | A | 12/2011 |
| TW | 201310524 | A | 3/2013 |
| TW | 201812075 | A | 4/2018 |
| TW | 201921483 | A | 6/2019 |

OTHER PUBLICATIONS

Office Action mailed Feb. 15, 2025, issued for CN202180017626.1 and English translation of the Search Report.
Supplementary European Search Report mailed Mar. 11, 2024, issued for European Patent Application No. 21764037.4.
Office Action mailed Dec. 25, 2024, issued for TW110107847 and English translation thereof.
Notice of Allowance issued in Taiwanese Patent Application No. TW 110107847, mailed Aug. 28, 2025, with English translation.

* cited by examiner

MEMBER FOR PLASMA PROCESSING APPARATUS, METHOD FOR MANUFACTURING SAME, AND PLASMA PROCESSING APPARATUS

TECHNICAL FIELD

The present invention relates to a member for a plasma processing apparatus, a method for manufacturing the same, and a plasma processing apparatus.

Priority is claimed on Japanese Patent Application No. 2020-037969 filed Mar. 5, 2020 and Japanese Patent Application No. 2021-020070 filed Feb. 10, 2021, the contents of which are incorporated herein by reference.

BACKGROUND ART

A plasma processing apparatus such as a plasma etching apparatus or a plasma CVD apparatus used in a semiconductor device manufacturing process is provided with a pair of electrodes disposed so as to face each other in a vertical direction in a vacuum chamber. Normally, a vent hole for passing a gas for plasma generation is formed in an upper electrode, a lower electrode serves as a pedestal, and a substrate to be processed such as a wafer can be fixed. While a gas for plasma generation is supplied from the vent hole of the upper electrode (also referred to as a ceiling electrode plate) to the substrate to be processed fixed to the lower electrode, plasma is generated by applying a high frequency voltage between the upper electrode and the lower electrode thereof, and the substrate to be processed is subjected to processing such as etching.

In the plasma processing apparatus having the above configuration, a cooling plate is disposed on a surface (back surface) of the upper electrode opposite to the lower electrode, and heat generated together with the plasma can be radiated to the cooling plate via the upper electrode. In order to improve the thermal conductivity between the upper electrode and the cooling plate and ensure a heat soaking property of the electrode, disposing a heat transfer material between the upper electrode and the cooling plate can be considered. For example, a technique of disposing a silicone resin containing an alumina filler between the upper electrode and the cooling plate has been studied (Patent Document 1).

In addition, in order to suppress fluctuations in the conditions of etching processing due to heat, disposing a heat transfer material (heat transfer sheet) with high thermal conductivity (Patent Document 2) between an annular support ring (focus ring) supported by a peripheral edge portion of an object to be processed and a pedestal (loading table) on which the focus ring is disposed can be considered. Patent Document 2 describes a silicone rubber having heat resistance and containing alumina in a grain state as the heat transfer material.

CITATION LIST

Patent Documents

Patent Document 1

Japanese Patent No. 5762798

Patent Document 2

Japanese Unexamined Patent Application, First Publication No. 2012-9563

SUMMARY OF INVENTION

Technical Problem

In order to ensure a heat soaking property of the electrode plate for the plasma processing apparatus used as the upper electrode for a long period of time, it is important to efficiently transfer the heat in the plasma processing apparatus to the cooling plate via the electrode plate for the plasma processing apparatus for a long period of time. Therefore, the heat transfer material disposed between the electrode plate for the plasma processing apparatus and the cooling plate is unlikely to be deteriorated by heat, plasma, and radicals of by-products (plasma in a broad sense), and preferably has a high heat transfer property for a long period of time. In addition, in order to prevent contamination (contamination of the substrate to be processed) due to deterioration of the heat transfer material, it is preferable that the heat transfer material have high plasma resistance. In addition, the same applies to the heat transfer material disposed between the annular focus ring supporting the peripheral edge portion of the object to be processed and the pedestal.

The present invention has been made in view of the above-described circumstances, and it is also an objective of the present invention to provide a member for a plasma processing apparatus such as an electrode plate for the plasma processing apparatus and a focus ring including a heat transfer material with excellent heat resistance and plasma resistance and having a high heat soaking property for a long period of time, and a method for manufacturing the same. Furthermore, it is also an objective of the present invention to provide a plasma processing apparatus in which contamination is unlikely to occur.

Solution to Problem

In order to solve the above problems, a member for a plasma processing apparatus according to an aspect of the present invention is a member for a plasma processing apparatus including a base material and a heat transfer layer provided on one surface of the base material, in which the heat transfer layer contains at least one of a fluorine-based resin and a fluorine-based elastomer.

According to the member for the plasma processing apparatus having this configuration, the heat transfer layer contains at least one of a fluorine-based resin and a fluorine-based elastomer, and thus has excellent heat resistance and plasma resistance. Therefore, the member for the plasma processing apparatus has a high heat soaking property for a long period of time, and is unlikely to cause contamination.

In the member for a plasma processing apparatus according to an aspect of the present invention, it is preferable that a material forming the base material be Si or SiC.

In this case, since the base material contains Si or SiC, the heat transfer property of the base material is improved. Therefore, the heat soaking property of the member for the plasma processing apparatus is improved.

In the member for a plasma processing apparatus according to an aspect of the present invention, it is preferable that the heat transfer layer contains a filler.

In this case, since the heat transfer layer contains the filler, the thermal conductivity of the heat transfer layer is improved. Therefore, the heat soaking property of the member for the plasma processing apparatus is further improved.

In the member for a plasma processing apparatus according to an aspect of the present invention, it is preferable that the filler be at least one of alumina and boron nitride.

In this case, since the heat transfer layer contains at least one of alumina and boron nitride, the thermal conductivity of the heat transfer layer is more reliably improved. Therefore, the heat soaking property of the member for the plasma processing apparatus is further improved.

In the member for a plasma processing apparatus according to an aspect of the present invention, it is preferable that the fluorine-based resin and the fluorine-based elastomer be compounds having a perfluoropolyether group.

In this case, since the heat transfer layer contains a compound having a perfluoropolyether group, the heat resistance and the plasma resistance of the heat transfer layer are further improved. Therefore, the member for the plasma processing apparatus has the high heat soaking property for a longer period of time, and is unlikely to cause contamination.

In the member for a plasma processing apparatus according to an aspect of the present invention, it is preferable that a thickness of the heat transfer layer be within the range of 20 μm or more and 1 mm or less.

In this case, since the thickness of the heat transfer layer is 20 μm or more, the heat transfer layer can be easily brought into close contact with the cooling plate or the pedestal of the plasma processing apparatus, and the thermal conductivity between the heat transfer layer and the cooling plate or between the heat transfer layer and the pedestal is improved. In addition, since the thickness of the heat transfer layer is 1 mm or less, the thermal conductivity of the heat transfer layer is also increased. Therefore, the heat soaking property of the member for the plasma processing apparatus is further improved.

The member for a plasma processing apparatus according to an aspect of the present invention may be an electrode plate for a plasma processing apparatus having a vent hole through which a gas for plasma generation passes.

In this case, in the electrode plate for a plasma processing apparatus, the base material may be a substrate having multiple vent holes, and the heat transfer layer may be provided on one surface of the substrate.

The substrate may have a disk shape and a thickness within a range of 1 mm or more and 20 mm or less, in which a diameter of the vent hole is within the range of 0.1 mm or more and 1 mm or less and an aspect ratio of the vent hole is 3 or more.

In the member for a plasma processing apparatus according to an aspect of the present invention, the member for a plasma processing apparatus may be a focus ring.

In this case, in the focus ring, the base material may be an annular base material including a flat part that is annular and a projection formed on an outer peripheral side of one surface of the flat part, and the heat transfer layer may be provided on a surface of the flat part opposite to a surface on which the projection is formed.

A method for manufacturing a member for a plasma processing apparatus according to another aspect of the present invention includes a preparation step of preparing a base material, a coating step of applying a coating composition containing a fluorine-based compound that produces at least one of a fluorine-based resin and a fluorine-based elastomer to one surface of the base material by heating or irradiation with ultraviolet rays to form a coating layer, and a heat transfer layer forming step of heating the coating layer or irradiating the coating layer with ultraviolet rays to produce a heat transfer layer containing at least one of the fluorine-based resin and the fluorine-based elastomer.

According to the method for manufacturing a member for a plasma processing apparatus having this configuration, since the coating composition is applied to the base material previously formed in a predetermined shape to produce the heat transfer layer, it is possible to efficiently manufacture the member for the plasma processing apparatus having various shapes such as the electrode plate for the plasma processing apparatus and the focus ring. Furthermore, the contact between the heat transfer layer and the base material can be improved, and the thermal resistance can be lowered. In addition, since the heat transfer layer contains at least one of a fluorine-based resin and a fluorine-based elastomer, the heat transfer layer has excellent heat resistance and plasma resistance. Therefore, the obtained member for the plasma processing apparatus has the high heat soaking property for a long period of time, and is unlikely to cause contamination.

In the method for manufacturing a member for a plasma processing apparatus according to an aspect of the present invention, it is preferable that the coating composition contain a filler.

In this case, since the coating composition contains the filler, the heat transfer layer to be formed contains the filler, and the thermal conductivity is improved. Therefore, it is possible to manufacture the member for the plasma processing apparatus having a further improved heat soaking property.

In the method for manufacturing an electrode plate for a plasma processing apparatus according to an aspect of the present invention, the base material may be a substrate having multiple vent holes, and the coating composition may be applied to one surface of the substrate.

In this case, since the heat transfer layer is formed on the base material having multiple vent holes, it is easy to align the positions of the vent hole of the base material and the vent hole of the heat transfer layer. Therefore, the electrode plate for the plasma processing apparatus having the vent hole can be efficiently manufactured. In addition, as a method for manufacturing an electrode plate for a plasma processing apparatus, a method for separately preparing a heat transfer material (heat transfer layer) having multiple vent holes and placing the heat transfer material on a base material can be considered. In this case, misalignment is likely to occur when the heat transfer material is placed on the base material. Therefore, it is necessary to have the vent hole of the heat transfer material sized so as to be able to absorb the misalignment. In that case, the contact surface between the cooling plate of the plasma processing apparatus and the heat transfer material and the contact area between the heat transfer material and the base material is reduced and heat is not efficiently transferred. Furthermore, when forming the vent hole in a separate heat transfer material, if there are multiple vent holes in the heat transfer material, the mechanical strength of the heat transfer material itself is weakened, and it is difficult to handle it as a separate heat transfer material. In particular, in a case where the amount of filler is increased, the mechanical strength of the heat transfer material itself is further weakened, and the amount of filler cannot be increased. On the other hand, according to the above-described manufacturing method, since it is not necessary to separate the heat transfer layers independently, it is possible to form a heat transfer layer having a large amount of filler. Therefore, by the above manufacturing method, it is possible to manufacture the electrode plate for the plasma processing apparatus having the heat soaking property and heat stability.

In the method for manufacturing an electrode plate for a plasma processing apparatus according to an aspect of the present invention, the base material may be an annular substrate including a flat part that is annular and a projection formed on an outer peripheral side of one surface of the flat part, and the coating composition may be applied to a surface of the flat part opposite to a surface on which the projection is formed.

In this case, since the base material is the annular substrate including the annular flat part and the projection formed on the outer peripheral side of one surface of the flat part, the focus ring can be efficiently manufactured.

The plasma processing apparatus according to still another aspect of the present invention is a plasma processing apparatus including an electrode plate for a plasma processing apparatus having a vent hole through which a gas for plasma generation passes and a focus ring, in which at least one of the electrode plate for a plasma processing apparatus and the focus ring includes a heat transfer layer, and the heat transfer layer contains at least one of a fluorine-based resin and a fluorine-based elastomer.

According to the plasma processing apparatus having this configuration, since the heat transfer layer contains at least one of a fluorine-based resin and a fluorine-based elastomer, the heat transfer layer has excellent heat resistance and plasma resistance. Therefore, at least one of the electrode plate for the plasma processing apparatus and the focus ring has the high heat soaking property and is unlikely to cause contamination.

Advantageous Effects of Invention

According to the above aspect of the present invention, it is possible to provide the member for the plasma processing apparatus including the heat transfer material with excellent heat resistance and plasma resistance and having the high heat soaking property for a long period of time, and the method for manufacturing the same. Furthermore, according to the present invention, it is possible to provide a plasma processing apparatus in which contamination is unlikely to occur.

DESCRIPTION OF EMBODIMENTS

Hereinafter, a member for a plasma processing apparatus according to an embodiment of the present invention, a method for manufacturing the same, and a plasma processing apparatus will be described with reference to the attached drawings as appropriate.

The plasma processing apparatus according to the present embodiment is, for example, a plasma processing apparatus such as a plasma etching apparatus or a plasma CVD apparatus used in a semiconductor device manufacturing process. The member for the plasma processing apparatus according to the present embodiment is a member used inside the plasma processing apparatus, and is, for example, an electrode plate for the plasma processing apparatus and a focus ring. The electrode plate for the plasma processing apparatus according to the present embodiment is, for example, used as an upper electrode among a pair of electrodes provided in a vacuum chamber of a plasma processing apparatus such as a plasma etching apparatus or a plasma CVD apparatus used in a semiconductor device manufacturing process. The focus ring according to the present embodiment is, for example, an annular support ring that supports an object to be processed disposed in a vacuum chamber of the plasma processing apparatus at the peripheral edge portion.

Figure 1:
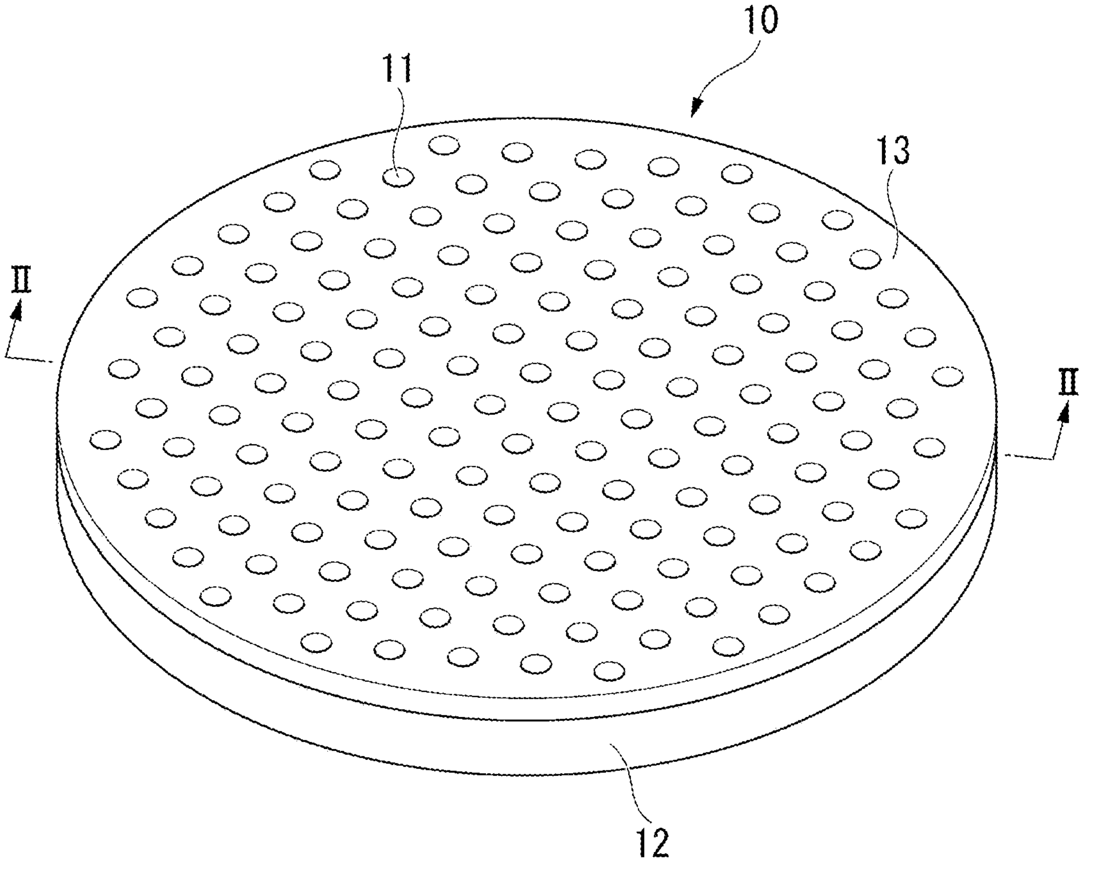
FIG. 1 is a perspective view of an example of an electrode plate for a plasma processing apparatus according to the present embodiment.
Figure 2:
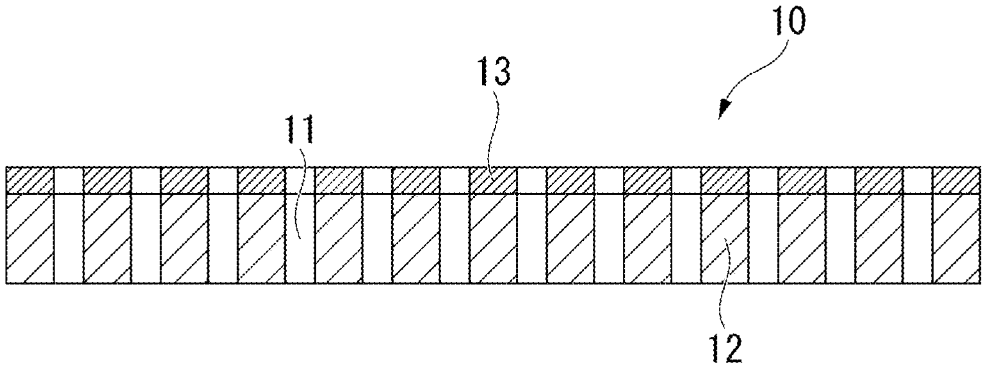
FIG. 2 is a cross-sectional view along the line II-II of FIG. 1.

FIG. 1 is a perspective view of an example of the electrode plate for the plasma processing apparatus according to the present embodiment, and FIG. 2 is a cross-sectional view along the line II-II of FIG. 1.

In FIGS. 1 and 2, an electrode plate 10 for the plasma processing apparatus has a disk shape, and a plurality of vent holes 11 through which a gas for plasma generation passes are formed. The electrode plate 10 for the plasma processing apparatus includes a base material 12 and a heat transfer layer 13 formed on a surface of the base material 12.

The vent hole 11 may be, for example, within the range having a diameter of 0.1 mm or more and 1 mm or less. The aspect ratio of the vent hole 11 in the base material 12 (thickness of the base material 12/diameter of the vent hole 11) may be 1 or more, and is preferably 3 or more. In addition, the aspect ratio of the vent hole 11 may be 200 or less.

The material constituting the base material 12 is not particularly limited, and is preferably silicon (Si) or silicon carbide (SiC). The diameter of the base material 12 may be, for example, within the range of 200 mm or more and 400 mm or less. The thickness of the base material 12 may be, for example, within the range of 1 mm or more and 20 mm or less.

The heat transfer layer 13 contains at least one of a fluorine-based resin (a fluororesin, or a fluorine-containing resin) and a fluorine-based elastomer (a fluoroelastomer, or a fluorine-containing elastomer). The heat transfer layer 13 may contain the fluorine-based resin alone, the fluorine-based elastomer alone, or may contain a mixture of the fluorine-based resin and the fluorine-based elastomer. The fluorine-based resin preferably has elasticity. The heat transfer layer 13 preferably contains a filler. The heat transfer layer 13 preferably has a configuration in which at least one of a fluorine-based resin and a fluorine-based elastomer is used as a matrix binder, and the filler is dispersed in the matrix binder.

The fluorine-based resin preferably has a fluorine-containing group in the main chain. The fluorine-based elastomer is preferably a fluorine-containing three-dimensional crosslinkable compound having a fluorine-containing group and a three-dimensional crosslinked structure. Examples of the fluorine-containing group include a perfluoroalkylene group $—(CF_2)_x—$ (x is an integer of 1 or more) and a perfluoropolyether group. Examples of the perfluoropolyether group include —$(CF_2CF_2O)_m(CF_2O)_n$— (m and n are integers of 1 or more), —$(CF_2CF_2CF_2O)_p$— (p is an integer of 1 or more), and —$(CF_2CF(CF_3)O)$q- (q is an integer of 1 or more). Examples of the three-dimensional crosslinked structure include an organic silicon structure having a bond between silicon and carbon, a silicone structure having a siloxane bond, an epoxy structure having an epoxy bond, and a urethane structure having a urethane bond. The fluorine-containing three-dimensional crosslinkable compound may be used alone or in a combination of two or more.

As the filler materials, alumina ($Al_2O_3$), alumina hydrate, aluminum nitride (AlN), silica ($SiO_2$), silicon carbide (SiC), titanium oxide ($TiO_2$), boron nitride (BN) and the like can be used. Alumina and boron nitride are preferable among these materials. The shape of the filler is not particularly limited, and may be spherical, flat, or fibrous, for example. The alumina is more preferably α-alumina. The boron nitride is more preferably granular boron nitride.

The content of the filler in the heat transfer layer 13 is preferably within the range of 50% by mass or more and 90% by mass or less. When the filler content is 50% by mass or more (the content of the matrix binder is less than 50% by mass), the thermal conductivity of the heat transfer layer 13 is improved, and when the content of the filler is 90% by mass or less (the content of the matrix binder is more than 10% by mass), the sheet formability is improved.

The thickness of the heat transfer layer 13 is preferably within the range of 20 μm or more and 1 mm or less, and particularly preferably within the range of 20 μm or more and 500 μm or less.

Next, a method for manufacturing the electrode plate 10 for the plasma processing apparatus of the present embodiment will be described.

The electrode plate 10 for the plasma processing apparatus can be manufactured by a method including the following steps.

(1) A preparation step of preparing a base material 12 having multiple vent holes 11.

(2) A coating step of applying a coating composition containing a fluorine-based compound that produces at least one of a fluorine-based resin and a fluorine-based elastomer to one surface of the base material 12 by heating or irradiation with ultraviolet rays to form a coating layer.

(3) A heat transfer layer forming step of heating the coating layer or irradiating the coating layer with ultraviolet rays to produce a heat transfer layer 13 containing at least one of a fluorine-based resin and a fluorine-based elastomer.

In the preparation step, a method for forming the vent hole 11 in the base material 12 is not particularly limited. For example, various methods used as a method for forming a vent holes 11 of an electrode plate 10 for a plasma processing apparatus, such as a method for mechanically forming a vent hole 11 using a drill and a method for thermally forming a vent hole 11 by irradiating with a laser, can be used. In the base material 12 in which the vent hole 11 is formed, burrs may be generated around the vent hole, and the flatness of the surface in which the vent hole is not formed may be lowered. When burrs are present around the vent hole or the flatness of the surface in which the vent hole is not formed is lowered, it contributes to uneven coating in a next coating step. Therefore, it is preferable that the flatness of the base material 12 in which the vent hole 11 is formed be improved by polishing the upper and lower surfaces of the base material 12 after removing burrs by etching processing before the coating step.

The coating composition used in the coating step is preferably a composition containing a fluorine-based compound and a filler. The coating composition may further contain a fluorine-based oil and a volatile solvent.

The fluorine-based compound is a compound that produces a fluorine-based resin and/or a fluorine-based elastomer by heating or irradiation with ultraviolet rays. The fluorine-based compound is preferably a fluorine-containing crosslinkable compound that produces a fluorine-containing three-dimensional crosslinkable compound by heating or irradiation with ultraviolet rays. As the fluorine-containing crosslinkable compound, a fluorine-containing crosslinkable organic silicon compound, a fluorine-containing crosslinkable silicone compound, a fluorine-containing crosslinkable epoxy compound, and a fluorine-containing crosslinkable urethane compound can be used. Examples of commercially available fluorine-based compounds include SHIN-ETSU STEEL (registered trademark) manufactured by Shin-Etsu Chemical Co., Ltd.

The fluorine-based oil acts as a viscosity modifier for the coating composition. The fluorine-based oil is preferably a liquid polymer having a perfluoropolyether group. Examples of the perfluoropolyether group are the same as in the case of the above-described fluorine-based resin and fluorine-based elastomer. The polymer of the fluorine-based oil may have a linear or branched saturated or unsaturated hydrocarbon group, an aromatic group, or a hydrocarbon group containing a heteroatom bonded to the perfluoropolyether group. Examples of commercially available fluorine-based oils are Fomblin (registered trademark) sold by Solvay SA, DEMNUM (registered trademark) sold by Daikin Industries, Ltd., and Krytox (registered trademark) sold by the Chemours Company. Examples of commercially available volatile solvents include Novec (registered trademark) sold by the 3M Company.

In the coating step, it is preferable to use screen-printing as a method for applying the coating composition to one surface of the base material 12. In addition, it is preferable to dispose a masking material in the vent hole 11 of the base material 12 before applying the coating composition. The masking material used for screen-printing may be a metal mask or a mesh mask. In addition, instead of disposing the masking material in the vent hole 11 of the base material 12, a mask patterned so as to close the vent hole 11 may be used.

In the heat transfer layer forming step, the coating layer is heated or the coating layer is irradiated with ultraviolet rays to produce a heat transfer layer 13 containing at least one of a fluorine-based resin and a fluorine-based elastomer. The heating temperature or the irradiation amount of ultraviolet rays is a condition under which the fluorine-based compound produces a fluorine-based resin and/or a fluorine-based elastomer.

By the above steps, the electrode plate 10 for the plasma processing apparatus of the present embodiment is manufactured.

Figure 3:
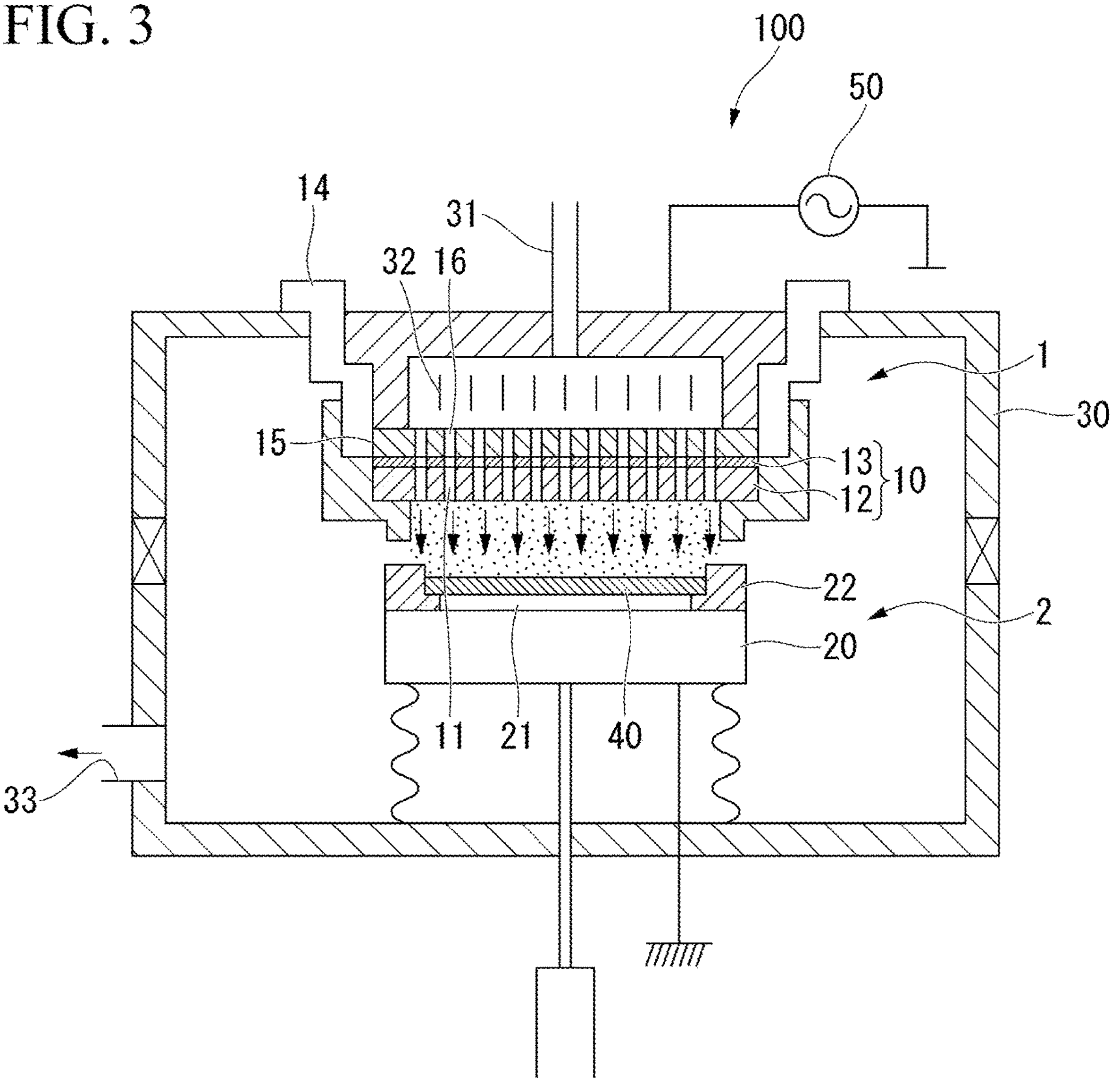
FIG. 3 is a schematic configuration diagram showing an example of a plasma etching apparatus according to the present embodiment.

The electrode plate 10 for the plasma processing apparatus is used as the upper electrode in the vacuum chamber of the plasma processing apparatus. FIG. 3 is a schematic configuration diagram showing an example of the plasma etching apparatus using the electrode plate 10 for the plasma processing apparatus according to the present embodiment.

As shown in FIG. 3, the plasma etching apparatus 100 includes a vacuum chamber 30, an etching gas feeding part 1 provided on the upper side in the vacuum chamber 30, and a support portion 2 of an object to be processed provided on the lower side in the vacuum chamber 30. In the etching gas feeding part 1, the electrode plate 10 (upper electrode) for the plasma processing apparatus according to the present embodiment is provided so as to face the heat transfer layer 13 upward. In addition, in the support portion 2 of the object to be processed, a pedestal (lower electrode) 20 that can move up and down is provided in parallel with the electrode plate 10 for the plasma processing apparatus at a mutual distance. In this case, the upper electrode plate 10 for the plasma processing apparatus is supported in an insulated state with respect to the wall of the vacuum chamber 30 by the insulator 14, the electrostatic chuck 21 and the focus ring (support ring) 22 made of silicon (Si) or silicon carbide (SiC) and surrounding the electrostatic chuck 21 are provided on the pedestal 20, and the wafer (substrate to be processed) 40 is placed on the electrostatic chuck 21 in a state where the peripheral edge portion is supported by the focus ring 22. In addition, an etching gas supply tube 31 is provided above the vacuum chamber 30, and an etching gas sent from the etching gas supply tube 31 is passed through a diffusion member 32, and then flowed toward a wafer 40 through the vent hole 11 provided in the electrode plate 10 for the plasma processing apparatus, and is discharged to the outside from an outlet 33 on the side of the vacuum chamber 30. On the other hand, a high frequency voltage is applied between the electrode plate 10 for the plasma processing apparatus and the pedestal 20 by a high frequency power supply 50.

A cooling plate 15 is fixed to the back surface of the electrode plate 10 for the plasma processing apparatus via the heat transfer layer 13. As the material of the cooling plate 15, aluminum or the like having excellent thermal conductivity is used. The cooling plate 15 is also formed with a through hole 16 at the same pitch as the vent hole 11 so as to communicate with the vent hole 11 of the electrode plate 10 for the plasma processing apparatus. The electrode plate 10 for the plasma processing apparatus is fixed in the plasma etching apparatus 100 by screwing or the like with the back surface in contact with the cooling plate 15.

The gas for plasma generation passes downward through the vent hole 11 from above (in the arrow direction), and the plasma is generated below the electrode plate 10 for the plasma processing apparatus. The heat generated together with the plasma is transferred from the base material 12 of the electrode plate 10 for the plasma processing apparatus to the cooling plate 15 via the heat transfer layer 13 and radiated to the outside.

Next, the focus ring according to the present embodiment will be described.

Figure 4:
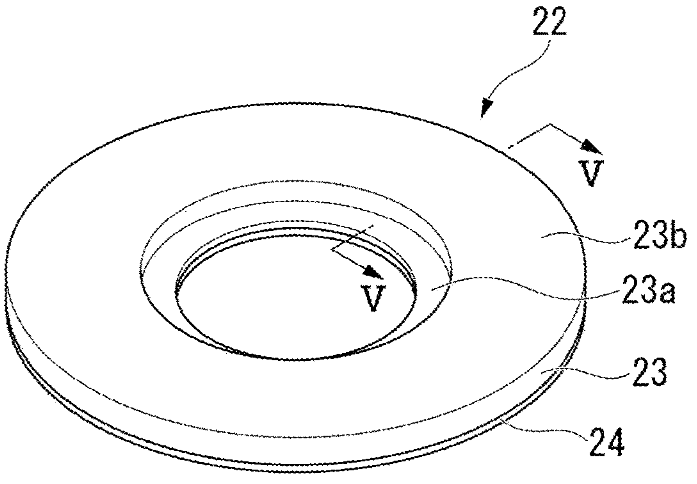
FIG. 4 is a perspective view of an example of a focus ring according to the present embodiment.
Figure 5:
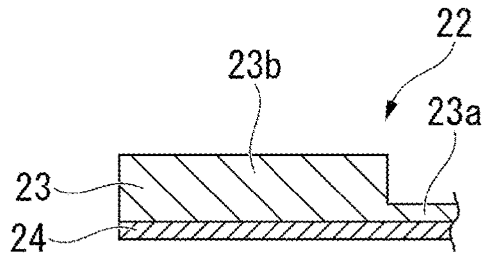
FIG. 5 is a cross-sectional view along the line V-V of FIG. 4.

FIG. 4 is a perspective view of an example of the focus ring according to the present embodiment, and FIG. 5 is a cross-sectional view along the line V-V of FIG. 4.

In FIGS. 4 and 5, the focus ring 22 includes an annular base material 23 having a circular opening in the center and a heat transfer layer 24. The annular base material 23 includes an annular flat part 23*a* and a projection 23*b* formed on the outer peripheral side of one surface of the flat part 23*a*. The heat transfer layer 24 is provided on the surface of the annular base material 23 opposite to the surface on which the projection 23*b* is formed.

The annular base material 23 may be, for example, within the range having a diameter of 350 mm or more and 500 mm or less. The opening diameter at the center of the annular base material 23 may be within the range of 295 mm or more and 298 mm or less. In addition, the projection 23*b* of the annular base material 23 may be, for example, within the range having a thickness of 2 mm or more and 8 mm or less. The flat part 23*a* of the annular base material 23 may be within the range having a thickness of 0.5 mm or more and 7.5 mm or less. The material constituting the annular base material 23 is not particularly limited, and is preferably silicon (Si) or silicon carbide (SiC). The flat part 23*a* of the annular base material 23 may not be a perfect circle.

The heat transfer layer 24 contains at least one of a fluorine-based resin and a fluorine-based elastomer. The heat transfer layer 24 preferably contains a filler. Examples of the fluorine-based resin, the fluorine-based elastomer, and the filler contained in the heat transfer layer 24 are the same as in the case of the electrode plate 10 for the plasma processing apparatus described above. In addition, the thickness of the heat transfer layer 24 is preferably within the range of 20 μm or more and 1 mm or less, and particularly preferably within the range of 20 μm or more and 500 μm or less, as in the case of the electrode plate 10 for the plasma processing apparatus described above.

The focus ring 22 can be manufactured by a method including the following steps.

(1) A preparation step of preparing an annular base material 23 having an annular flat part 23*a* and a projection 23*b* formed on the outer peripheral side of one surface of the flat part 23*a*.

(2) A coating step of applying a coating composition containing a fluorine-based compound that produces at least one of a fluorine-based resin and a fluorine-based elastomer to the surface of the annular base material 23 opposite to the surface on which the projection 23*b* is formed by heating or irradiation with ultraviolet rays to form a coating layer.

(3) A heat transfer layer forming step of heating the coating layer or irradiating the coating layer with ultraviolet rays to produce a heat transfer layer 24 containing at least one of a fluorine-based resin and a fluorine-based elastomer.

In the preparation step, a method for forming the annular base material 23 is not particularly limited. For example, a method for mechanically processing it into an annular shape using a drill can be used. In addition, as the annular base material 23, a member formed by adhering a plurality of arcuate members in a ring shape in the circumferential direction may be used. A focus ring having a configuration formed by adhering a plurality of arcuate members is described in Japanese Unexamined Patent Application, First Publication No. 2011-3730. In the focus ring having this configuration, the above-described fluorine-based resin and/or fluorine-based elastomer may be used as the adhesive for adhering the plurality of arcuate members.

The method for coating the coating composition in the coating step and the method for forming the heat transfer layer 24 in the heat transfer layer forming step are not particularly limited, and for example, the same method as in the case of the above-described electrode plate 10 for the plasma processing apparatus may be used.

Figure 6:
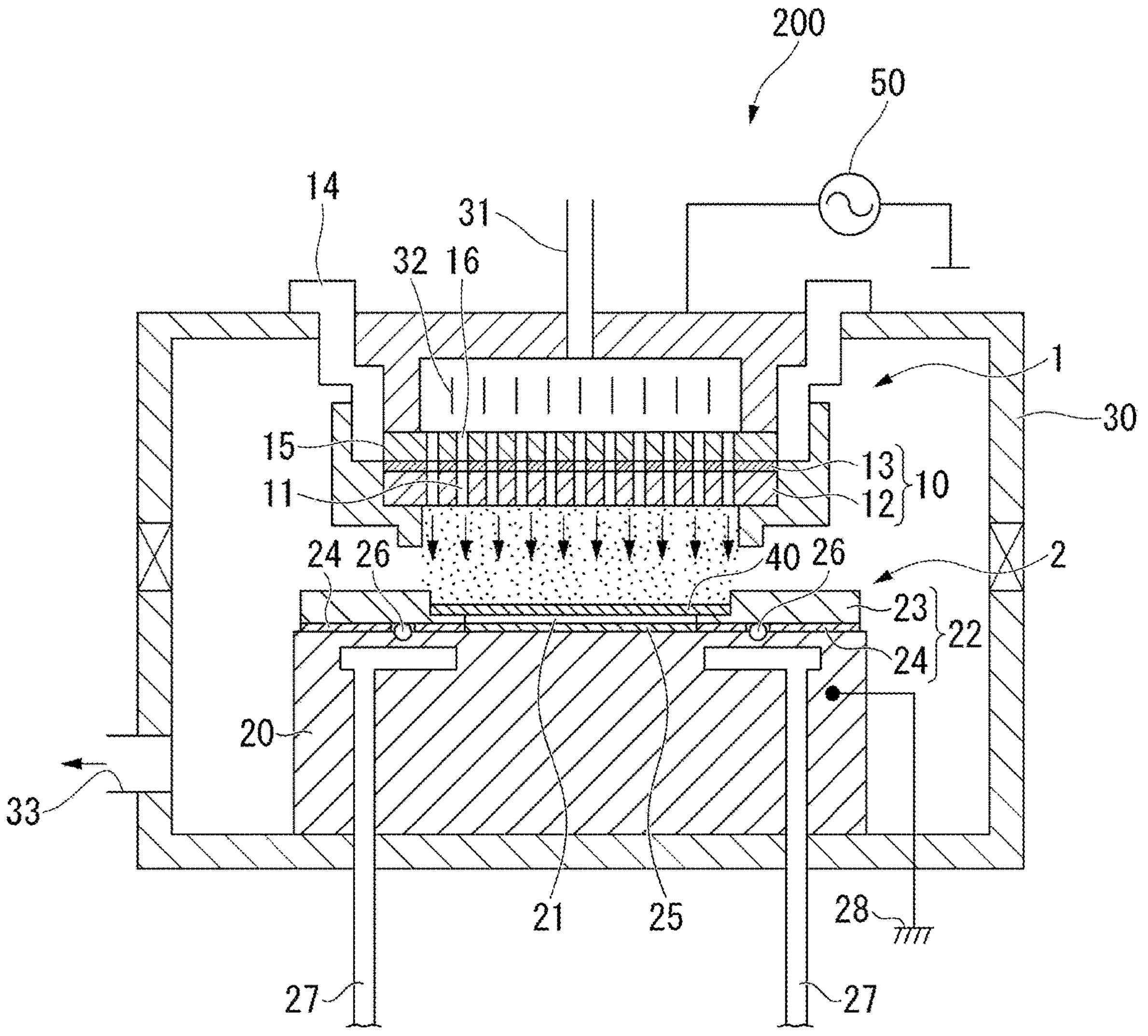
FIG. 6 is a schematic configuration diagram showing another example of the plasma etching apparatus according to the present embodiment.

FIG. 6 is a schematic configuration diagram showing another example of the plasma etching apparatus according to the present embodiment. A plasma etching apparatus 200 shown in FIG. 6 is the same as the plasma etching apparatus 100 shown in FIG. 3, except that one having the above-described annular base material 23 and the heat transfer layer 24 is used as the focus ring 22. Therefore, in the plasma etching apparatus 200 shown in FIG. 6, the parts common to the plasma etching apparatus 100 shown in FIG. 3 are designated by the same reference numerals, and detailed description thereof will be omitted.

In the plasma etching apparatus 200 shown in FIG. 6, the support portion 2 of the object to be processed includes the pedestal 20, the electrostatic chuck 21, the focus ring 22, and a heat removal plate 25.

The pedestal 20 has a circular shape in a plan view. The focus ring 22 is disposed on the outer peripheral portion of the pedestal 20. The focus ring 22 supports a peripheral edge portion of the wafer 40 by the annular base material 23. The heat removal plate 25 is disposed at the center of the pedestal 20, and the electrostatic chuck 21 is disposed on the heat removal plate 25. The pedestal 20 includes a refrigerant passage 27 inside the pedestal 20 and also functions as a cooling portion. In addition, the pedestal 20 is connected to an earth 28 and also functions as an electrode portion. The electrostatic chuck 21 may be connected to a high frequency power supply (not shown).

An O-ring 26 is disposed between the pedestal 20 and the focus ring 22. The O-ring 26 is disposed in an annular shape in a plan view. As the material of the O-ring 26, for example, an elastic body having heat resistance such as silicone rubber and a fluorine-based elastomer can be used. An intermediate layer may be provided on at least one of the pedestal 20 and the focus ring 22. The intermediate layer may be a ceramic sintered body such as alumina, yttria, silicon carbide, aluminum nitride, or silicon nitride.

According to the member for the plasma processing apparatus (the electrode plate 10 for the plasma processing apparatus and the focus ring 22) of the present embodiment configured as described above, since the heat transfer layer contains at least one of a fluorine-based resin and a fluorine-based elastomer, the heat transfer layer has excellent heat resistance and plasma resistance. Therefore, the member for the plasma processing apparatus has a high heat soaking property for a long period of time, and is unlikely to cause contamination.

In the member for the plasma processing apparatus of the present embodiment, in a case where the material forming the base material (base material 12 and annular base material 23) is Si or SiC, the heat transfer property of the base material is improved. Therefore, the heat soaking property of the member for the plasma processing apparatus is improved.

In the member for the plasma processing apparatus of the present embodiment, in a case where the heat transfer layers 13 and 24 contain a filler, the thermal conductivity of the heat transfer layer is improved. Therefore, the heat soaking property of the member for the plasma processing apparatus is further improved. Furthermore, in a case where the filler is at least one of alumina and/or boron nitride, the thermal conductivity of the heat transfer layers 13 and 24 is more reliably improved. Therefore, the heat soaking property of the member for the plasma processing apparatus is further improved. In addition, in the member for the plasma processing apparatus of the present embodiment, in a case where the fluorine-based resin and the fluorine-based elastomer are compounds having a perfluoropolyether group, the heat resistance and the plasma resistance of the heat transfer layers 13 and 24 are further improved. Therefore, the member for the plasma processing apparatus has the high heat soaking property for a longer period of time, and is unlikely to cause contamination. Furthermore, in the member for the plasma processing apparatus of the present embodiment, in a case where the thickness of the heat transfer layers 13 and 24 is within the range of 20 μm or more and 1 mm or less, the heat transfer layers 13 and 24 is easily brought into close contact with the cooling plate 15 and the pedestal 20 of the plasma processing apparatus, and the thermal conductivity between the heat transfer layer 13 and the cooling plate 15 and between the heat transfer layer 24 and the pedestal 20 is improved. In addition, since the thickness of the heat transfer layers 13 and 24 is 1 mm or less, the thermal conductivity of the heat transfer layers 13 and 24 is also increased. Therefore, the heat soaking property of the member for the plasma processing apparatus is further improved.

The member for the plasma processing apparatus of the present embodiment may be the electrode plate 10 for the plasma processing apparatus having the vent hole 11 through which a gas for plasma generation is passed. In this case, the electrode plate 10 for the plasma processing apparatus may have a configuration in which the base material 12 is a substrate having multiple vent holes 11 and the heat transfer layer 13 is provided on one surface of the base material 12. Furthermore, the base material 12 has a disk shape, the thickness is within the range of 1 mm or more and 20 mm or less, the diameter of the vent hole 11 is within the range of 0.1 mm or more and 1 mm or less, and the aspect ratio of the vent hole 11 may be 1 or more, and preferably 3 or more. In this case, since the electrode plate 10 for the plasma processing apparatus has high adhesion to the cooling plate 15 of the plasma etching apparatus 100 and has the high heat soaking property for a long period of time, and is unlikely to cause contamination, plasma processing can be stably performed for a long period of time.

The member for the plasma processing apparatus of the present embodiment may be the focus ring 22. In this case, the focus ring 22 may be the annular base material 23 in which the base material includes the annular flat part **23*a* and the projection 23*b* formed on the outer peripheral side of one surface of the flat part 23*a*, and the heat transfer layer 24 may be provided on a surface of the flat part 23*a* opposite to the surface on which the projection 23*b* is formed. In this case, since the focus ring 22 has high adhesion to the pedestal 20 of the plasma etching apparatus 200** and has the high heat soaking property for a long period of time, and is unlikely to cause contamination, plasma processing can be stably performed for a long period of time.

According to the method for manufacturing the member for the plasma processing apparatus of the present embodiment, since the coating composition is applied to the base material previously formed in a predetermined shape to produce the heat transfer layer, it is possible to efficiently manufacture the member for the plasma processing apparatus having various shapes such as the electrode plate 10 for the plasma processing apparatus and the focus ring 22. Furthermore, the contact between the heat transfer layer and the base material can be improved, and the thermal resistance can be lowered. In addition, since the heat transfer layer contains at least one of a fluorine-based resin and a fluorine-based elastomer, the heat transfer layer has excellent heat resistance and plasma resistance. Therefore, the obtained member for the plasma processing apparatus has the high heat soaking property for a long period of time, and is unlikely to cause contamination.

In the method for manufacturing the member for the plasma processing apparatus of the present embodiment, the base material may be the base material 12 having multiple vent holes 11, and the coating composition may be applied to one surface of the base material 12. In this case, since the heat transfer layer 13 is formed on the base material 12 having multiple vent holes 11, it is easy to align the positions of the vent holes 11 of the base material 12 and the vent hole 11 of the heat transfer layer 13. Therefore, the electrode plate 10 for the plasma processing apparatus having the vent holes 11 can be efficiently manufactured. In addition, as a method for manufacturing the electrode plate 10 for the plasma processing apparatus, a method for separately preparing a heat transfer material (heat transfer layer) having multiple vent holes 11 and placing the heat transfer material on the base material can be considered. In this case, misalignment is likely to occur when the heat transfer material is placed on the base material. Therefore, it is necessary to have the vent holes of the heat transfer material sized so as to be able to absorb the misalignment. In that case, the contact surface between the cooling plate of the plasma processing apparatus and the heat transfer material and the contact area between the heat transfer material and the base material is reduced and heat is not efficiently transferred. Furthermore, when forming the vent holes in a separate heat transfer material, if there are multiple vent holes in the heat transfer material, the mechanical strength of the heat transfer material itself is weakened, and it is difficult to handle it as a separate heat transfer material. In particular, in a case where the amount of filler is increased, the mechanical strength of the heat transfer material itself is further weakened, and the amount of filler cannot be increased. On the other hand, according to the above-described manufacturing method, since it is not necessary to separate the heat transfer layers independently, it is possible to form a heat transfer layer having a large amount of filler. Therefore, by the above manufacturing method, it is possible to manufacture the electrode plate 10 for the plasma processing apparatus having the heat soaking property and heat stability.

In the method for manufacturing the electrode plate for the plasma processing apparatus of the present embodiment, in a case where the base material is the annular base material 23 having the annular flat part 23*a* and the projection 23*b* formed on the outer peripheral side of one surface of the flat part 23*a*, and the coating composition is applied to the surface of the flat part 23*a* opposite to the surface on which the projection 23*b* is formed, the focus ring 22 can be efficiently manufactured.

According to the plasma etching apparatuses 100 and 200 of the present embodiment, since the heat transfer layers 13 and 24 contain at least one of a fluorine-based resin and a fluorine-based elastomer, the heat transfer layers 13 and 24 have excellent heat resistance and plasma resistance. Therefore, at least one of the electrode plate 10 for the plasma processing apparatus and the focus ring 22 has the high heat soaking property and is unlikely to cause contamination.

Although the embodiments of the present invention have been described above, the present invention is not limited thereto, and can be appropriately changed without departing from the technical idea of the invention. For example, in the plasma etching apparatus 200 of the present embodiment shown in FIG. 6, both the heat transfer layer 13 of the electrode plate 10 for the plasma processing apparatus and the heat transfer layer 24 of the focus ring 22 are configured to contain at least one of a fluorine-based resin and a fluorine-based elastomer. When the heat transfer layer 24 of the focus ring 22 is configured to contain at least one of a fluorine-based resin and a fluorine-based elastomer, the heat transfer layer 13 of the electrode plate 10 for the plasma processing apparatus may not contain the fluorine-based resin and the fluorine-based elastomer.

EXAMPLES

Example 1 of Present Invention (1) Preparation of Coating Composition

A rubber agent I (X-71-6053-6A, manufactured by Shin-Etsu Chemical Co., Ltd.) having a perfluoropolyether group and having heat crosslinkability was mixed at a ratio of 8.7 parts by mass, a rubber agent II (X-71-6053-6B, manufactured by Shin-Etsu Chemical Co., Ltd.) having a perfluoropolyether group and having heat crosslinkability was mixed at a ratio of 9.0 parts by mass, a large particle size alumina filler (AA-18, manufactured by Sumitomo Chemical Co., Ltd., average particle size (d50): 18 μm) was mixed at a ratio of 57.2 parts by mass, and a small particle size alumina filler (AA-3, manufactured by Sumitomo Chemical Co., Ltd., average particle size (d50): 3 μm) was mixed at a ratio of 25.1 parts by mass (content of thermally conductive filler: 82.3% by mass). The obtained mixture was kneaded while defoaming using a rotation/revolution vacuum mixer (Awatori Rentaro ARV-310, manufactured by Shinky Co., Ltd.) to prepare a coating composition.

(2) Preparation of Electrode Plate Base Material for Plasma Processing Apparatus A vent hole was formed on the Si substrate using a drill. Next, burrs generated around the vent hole on the upper and lower surfaces of the Si substrate were removed by etching processing, and then the upper and lower surfaces of the Si substrate were polished to prepare an electrode plate base material for a plasma processing apparatus.

(3) Preparation of Electrode Plate for Plasma Processing Apparatus

A masking material was disposed in the vent hole on one surface of the electrode plate base material for the plasma processing apparatus prepared in (2) above. Next, the coating composition prepared in (1) above was applied to the surface of the electrode plate for the plasma processing apparatus by a screen-printing using a metal mask provided with an opening having the same diameter as the electrode plate base material for the plasma processing apparatus to form a coating layer having the thickness of 0.3 mm after heating. The electrode plate base material for the plasma processing apparatus on which the coating layer was formed was put into a heating furnace and heated at 150° C. for 30 hours. Next, the electrode plate base material for the plasma processing apparatus was taken out of the heating furnace, allowed to cool to room temperature, and after it was confirmed that the coating layer was cured and the heat transfer layer was formed, the masking material was removed. In this manner, an electrode plate for a plasma processing apparatus was prepared.

(4) Evaluation (Thickness of Heat Transfer Layer of Electrode Plate for Plasma Processing apparatus)

The electrode plate for the plasma processing apparatus after the heat transfer layer was formed was cut, and the film thickness was obtained from the SEM photograph of the cross section. As a result, it was confirmed that the average thickness of the heat transfer layer was 0.3 mm.

(Radical Irradiation Reduced Rate)

A radical irradiation reduced rate after radical irradiation was calculated based on the following formula under the $O_2$ rich condition in which $O_2$ and $CF_4$ were used as reaction gases, their flow rates were 500 ml/min and 10 ml/min, respectively, the reaction pressure was 40 Pa and the radical irradiation time was 1 hour, and the $CF_4$ rich condition in which $O_2$ and $CF_4$ were used as reaction gases, their flow rates were 100 ml/min and 410 ml/min, respectively, the reaction pressure as 100 Pa, and the radical irradiation time as 1 hour on the heat transfer layer of the electrode plate for the plasma processing apparatus. As a result, the radical irradiation reduced rate was 0% by mass under both the $O_2$ rich condition and the $CF_4$ rich condition.

Radical irradiation reduced rate (% by mass)=[(mass before irradiation−mass after irradiation)/mass before irradiation]×100 (Here, the mass before irradiation is the mass of the electrode plate for the plasma processing apparatus before radical irradiation, and the mass after irradiation is the mass of the electrode plate for the plasma processing apparatus after radical irradiation.)

(Heating Reduced Rate)

A heating reduced rate of the electrode plate for the plasma processing apparatus after being heated in air at 240° C. for 5 hours was calculated based on the following formula. In addition, the heating reduced rate after heating in air at 240° C. for 75 hours was calculated in the same manner. As a result, the heating reduced rate when heated at 240° C. for 5 hours was 0.8% by mass, and the heating reduced rate when heated at 240° C. for 75 hours was 3.2% by mass.

$$\text{Heating reduced rate (\% by mass)}=[(\text{mass before heating}-\text{mass after heating})/\text{mass before heating}]\times 100$$

(Here, the mass before heating is the mass of the electrode plate for the plasma processing apparatus before heating, and the mass after heating is the mass of the electrode plate for the plasma processing apparatus after heating.)

Example 2 of Present Invention

An annular base material made of Si having an annular flat part and a projection formed on an outer peripheral side of one surface of the flat part was prepared. The coating composition prepared in (1) of Example 1 of the present invention was applied to the surface of the annular base material opposite to the surface on which the projection was formed by a screen-printing to form a coating layer having a thickness of 0.3 mm after heating. The annular base material on which the coating layer was formed was put into a heating furnace and heated at 150° C. for 30 hours. Next, the annular base material was taken out of the heating furnace and allowed to cool to room temperature, and it was confirmed that the coating layer was cured and the heat transfer layer was formed. In this manner, a focus ring for a plasma processing apparatus was prepared.

For the obtained focus ring for the plasma processing apparatus, the thickness of the heat transfer layer, the radical irradiation reduced rate, and the heating reduced rate were measured in the same manner as in Example 1 of the present invention. As a result, the thickness of the heat transfer layer was 0.3 mm, the radical irradiation reduced rate was 0% by mass, the heating reduced rate when heated at 240° C. for 5 hours was 0.8% by mass, and the heating reduced rate when heated at 240° C. for 75 hours was 3.2% by mass.

INDUSTRIAL APPLICABILITY

According to the present invention, it is possible to provide the member for the plasma processing apparatus including the heat transfer material having the excellent heat resistance and plasma resistance and having the high heat soaking property for a long period of time, and the method for manufacturing the same. Furthermore, according to the present invention, it is possible to provide a plasma processing apparatus in which contamination is unlikely to occur.

REFERENCE SIGNS LIST

1: Etching gas feeding part
2: Support portion of object to be processed
10: Electrode plate for plasma processing apparatus
11: Vent hole
12: Base material
13: Heat transfer layer
14: Insulator
15: Cooling plate
20: Pedestal (lower electrode)
21: Electrostatic chuck
22: Focus ring
23: Annular base material
23*a*: Flat part
23*b*: Projection
24: Heat transfer layer
25: Heat removal plate
26: O-ring
27: Refrigerant passage
28: Earth
30: Vacuum chamber
31: Etching gas supply tube
32: Diffusion member
33: Outlet
40: Wafer (substrate to be processed)
50: High frequency power supply
100, 200: Plasma etching apparatus

What is claimed is:

1. A member for a plasma processing apparatus comprising:
a base material; and
a heat transfer layer provided on one surface of the base material, wherein
the heat transfer layer contains a fluorine-based elastomer,
the fluorine-based elastomer is a fluorine-containing three-dimensional crosslinkable compound having a fluorine-containing group and a three-dimensional crosslinked structure,
the fluorine-containing group is either one or both of a perfluoroalkylene group and a perfluoropolyether group, and
the three-dimensional crosslinked structure is either one of an epoxy structure having an epoxy bond or a urethane structure having a urethane bond.

2. The member for a plasma processing apparatus according to claim 1, wherein
a material forming the base material is Si or SiC.

3. The member for a plasma processing apparatus according to claim 1, wherein
the heat transfer layer contains a filler.

4. The member for a plasma processing apparatus according to claim 3, wherein
the filler is at least one of alumina and boron nitride.

5. The member for a plasma processing apparatus according to claim 1, wherein
the fluorine-containing group is the perfluoropolyether group or both of the perfluoroalkylene group and the perfluoropolyether group.

6. The member for a plasma processing apparatus according to claim 1, wherein
a thickness of the heat transfer layer is within a range of 20 μm or more and 1 mm or less.

7. The member for a plasma processing apparatus according to claim 1, wherein
the member for a plasma processing apparatus is an electrode plate for a plasma processing apparatus having a vent hole through which a gas for plasma generation passes.

8. The member for a plasma processing apparatus according to claim 7, wherein in the electrode plate for a plasma processing apparatus, the base material is a substrate having multiple vent holes, and the heat transfer layer is provided on one surface of the substrate.

9. The member for a plasma processing apparatus according to claim 8, wherein the substrate has a disk shape and a thickness within a range of 1 mm or more and 20 mm or less, in which a diameter of the vent hole is within a range of 0.1 mm or more and 1 mm or less and an aspect ratio of the vent hole is 3 or more.

10. The member for a plasma processing apparatus according to claim 1, wherein the member for a plasma processing apparatus is a focus ring.

11. The member for a plasma processing apparatus according to claim 10, wherein in the focus ring, the base material is an annular base material including a flat part that is annular and a projection formed on an outer peripheral side of one surface of the flat part, and the heat transfer layer is provided on a surface of the flat part opposite to a surface on which the projection is formed.

12. A method for manufacturing a member for a plasma processing apparatus comprising:

a preparation step of preparing a base material;

a coating step of applying a coating composition containing a fluorine-based compound that produces a fluorine-based elastomer to one surface of the base material by heating or irradiation with ultraviolet rays to form a coating layer; and a heat transfer layer forming step of heating the coating layer or irradiating the coating layer with ultraviolet rays to produce a heat transfer layer containing the fluorine-based elastomer, wherein the fluorine-based elastomer is a fluorine-containing three-dimensional crosslinkable compound having a fluorine-containing group and a three-dimensional crosslinked structure, the fluorine-containing group is either one or both of a perfluoroalkylene group and a perfluoropolyether group, and the three-dimensional crosslinked structure is either one of an epoxy structure having an epoxy bond or a urethane structure having a urethane bond.

13. The method for manufacturing a member for a plasma processing apparatus according to claim 12, wherein the base material is a substrate having multiple vent holes, and the coating composition is applied to one surface of the substrate.

14. The method for manufacturing a member for a plasma processing apparatus according to claim 12, wherein the base material is an annular substrate including a flat part that is annular and a projection formed on an outer peripheral side of one surface of the flat part, and the coating composition is applied to a surface of the flat part opposite to a surface on which the projection is formed.

15. A plasma processing apparatus comprising:

an electrode plate for a plasma processing apparatus having a vent hole through which a gas for plasma generation passes; and a focus ring, wherein the focus ring or each of both of the electrode plate for a plasma processing apparatus and the focus ring includes a heat transfer layer, and the heat transfer layer contains a fluorine-based elastomer, the fluorine-based elastomer is a fluorine-containing three-dimensional crosslinkable compound having a fluorine-containing group and a three-dimensional crosslinked structure, the fluorine-containing group is either one or both of a perfluoroalkylene group and a perfluoropolyether group, and the three-dimensional crosslinked structure is either one of an epoxy structure having an epoxy bond or a urethane structure having a urethane bond.

16. The member for a plasma processing apparatus according to claim 2, wherein the heat transfer layer contains a filler.

17. The member for a plasma processing apparatus according to claim 2, wherein the fluorine-containing group is the perfluoropolyether group or both of the perfluoroalkylene group and the perfluoropolyether group.

18. The member for a plasma processing apparatus according to claim 2, wherein a thickness of the heat transfer layer is within a range of 20 μm or more and 1 mm or less.

19. The member for a plasma processing apparatus according to claim 2, wherein the member for a plasma processing apparatus is an electrode plate for a plasma processing apparatus having a vent hole through which a gas for plasma generation passes.

20. The member for a plasma processing apparatus according to claim 2, wherein the member for a plasma processing apparatus is a focus ring.

* * * * *